US009176732B2

(12) United States Patent
Chakraborty et al.

(10) Patent No.: US 9,176,732 B2
(45) Date of Patent: Nov. 3, 2015

(54) METHOD AND APPARATUS FOR MINIMUM COST CYCLE REMOVAL FROM A DIRECTED GRAPH

(71) Applicant: Oracle International Corporation, Redwood City, CA (US)

(72) Inventors: Ashutosh Chakraborty, Austin, TX (US); Wonjoon Choi, Austin, TX (US); Duo Ding, Austin, TX (US); Rajendran Panda, Round Rock, TX (US)

(73) Assignee: Oracle International Corporation, Redwood City, CA (US)

( * ) Notice: Subject to any disclaimer, the term of this patent is extended or adjusted under 35 U.S.C. 154(b) by 88 days.

(21) Appl. No.: 14/012,799

(22) Filed: Aug. 28, 2013

(65) Prior Publication Data

US 2015/0067644 A1    Mar. 5, 2015

(51) Int. Cl.
| | | |
|---|---|---|
| *G06F 9/44* | (2006.01) | |
| *G06F 11/36* | (2006.01) | |
| G06F 9/45 | (2006.01) | |
| G06F 17/50 | (2006.01) | |

(52) U.S. Cl.
CPC *G06F 8/75* (2013.01); *G06F 11/36* (2013.01); G06F 8/433 (2013.01); G06F 8/443 (2013.01); G06F 9/44 (2013.01); G06F 9/4433 (2013.01); G06F 17/50 (2013.01); G06F 17/5009 (2013.01)

(58) Field of Classification Search
CPC ... G06F 17/50; G06F 17/505; G06F 17/5009; G06F 8/75; G06F 8/433; G06F 8/443; G06F 11/36; G06F 11/206; G06F 9/44; G06F 9/4433
See application file for complete search history.

(56) References Cited

U.S. PATENT DOCUMENTS

| | | | | |
|---|---|---|---|---|
| 5,663,891 | A  * | 9/1997 | Bamji et al. | 716/122 |
| 7,478,375 | B1 * | 1/2009 | Kersters | 717/144 |
| 2003/0221182 | A1 * | 11/2003 | Tip et al. | 717/116 |
| 2005/0182708 | A1 * | 8/2005 | Moudgal | 705/38 |
| 2007/0052705 | A1 * | 3/2007 | Oliveira et al. | 345/423 |
| 2010/0107137 | A1 * | 4/2010 | Trefler et al. | 717/111 |
| 2013/0024561 | A1 * | 1/2013 | Imai | 709/224 |
| 2014/0095125 | A1 * | 4/2014 | Nachbagauer | 703/2 |

* cited by examiner

*Primary Examiner* — Van Nguyen
*Assistant Examiner* — Tina Huynh
(74) *Attorney, Agent, or Firm* — Polsinelli PC

(57) ABSTRACT

Implementations of the present disclosure involve a system and/or method for minimum cost cycle removal from a directed graph. The system determines if a provided graph contains any cycles by assigning each vertex an integer value and comparing the integer values of vertices connected by an edge. When the value of a starting vertex is greater than an ending vertex, a cycle is present. The system then determines which edges may be removed in order to minimize the cost of breaking the cycle. The system generates a linear cost function that is equal to the sum of a cost to remove an edge multiplied by a corresponding binary variable. Constraints are generated to ensure that the result does not have any cycles. The system then solves for the minimum of the linear cost function by utilizing the constraints. The value of the binary variables may then be used to determine which edges to remove.

19 Claims, 6 Drawing Sheets

METHOD AND APPARATUS FOR MINIMUM COST CYCLE REMOVAL FROM A DIRECTED GRAPH

FIELD OF THE DISCLOSURE

Aspects of the present disclosure relate to directed graphs. More particularly, aspects of the present disclosure involve an apparatus and method for removing cycles from a directed graph at a lowest possible cost.

BACKGROUND

Software applications generally have a series of operations that are performed both sequentially and in parallel. Oftentimes, an operation will depend on a result from one or more other operations. Problems arise when a set of operations become interdependent on each other, where a first operation, directly or through intermediate operations, depends on the output of another operation, which in turn depends directly or through intermediate operations, on the first operation. These interdependencies can cause an application to fall into infinite loops where each operation is waiting for results from one or more other operations. These dependencies may be represented as a directed graph.

A directed graph is a structure containing a set of vertices, connected by edges that have a direction. Graph traversal is the process of visiting all of the vertices in the graph. The graph may be traversed by starting at one of the vertices and following the edges until each vertex that is reachable from that vertex has been visited. In the case of disconnected graphs, one may need to start traversal from various vertices. A cycle in a directed graph refers to a loop in the graph such that when traversing the edges away from a vertex, eventually we come back to the same node.

Referring to FIG. 1, a directed graph 100 is depicted. The directed graph includes three vertices 110, 115, 120 connected by three directed edges 125, 130, 135. The direction of each edge is indicated by an arrow at the end of each edge. The depicted graph 100 also forms a cycle starting at vertex A 110, traveling from vertex A 110 to vertex B 115 over edge AB 125, traveling from vertex B 115 to vertex C 120 over edge BC 130, and returning to vertex A 110 over edge CA 135.

In the context of software, vertex A (110) may signify a first operation, vertex B (115) may signify a second operation, and vertex C (120) may signify a third operation. The edges AB (125), BC (130), and CA (135) may signify dependencies between the operations. Thus, the first operation (vertex A) requires a result from the third operation (vertex C), the second operation (vertex B) requires a result from the first operation (vertex A), and the third operation (vertex C) requires a result from the second operation (vertex B). Thus, none of the operations can be completed because each operation is dependent on another operation resulting in an infinite loop.

Applications that fall into infinite dependency loops are often configured to automatically break out of these loops by removing a dependency (an edge in a graph) and accepting any repercussions caused by removing the dependency. In many instances, breaking a cycle does not cause an application to fail when run, but instead introduces inaccuracy into the analysis that the application was intended to perform. In cases where the options are for the application to be stuck in an infinite loop or for the application to produce a less accurate result, the less accurate result is the more desirable option.

Static timing analysis applications sometimes have issues related to dependency loops. Static timing analysis is related to computing the expected timing of a digital circuit. When designing a digital circuit, the designer must account for the various delays between different circuit elements so that the results of a series of operations in the circuit arrive at a destination at the correct time based on a clock signal. Since processing signals within a circuit may have dependencies on other signals, timing of the signals is critical. Similar to the hypothetical application above, the digital circuit may be depicted as a directional graph. In some cases, the digital circuit may have cycles leading to infinite dependency loops. In order to perform static timing analysis, the infinite loops must be broken at the expense of reduced accuracy.

Another example is in the field of datapath placement. A datapath includes a set of functional units connected to a system bus that operate to perform data processing operations. Similarly to the examples provided above, the datapath placement may include interdependencies between operations which may lead to loops if the function performing the operations needs to be placed in the direction of data flow, and if the data has a cyclic dependency. Again, by breaking the loop, a valid placement is obtained at the cost of increased inaccuracy of mimicking the data flow.

It is with these and other issues in mind that various aspects of the present disclosure were developed.

SUMMARY

Implementations of the present disclosure involve a system and/or method for minimum cost cycle removal from a directed graph. More specifically, the system and method allow for the determination of whether a directed graph contains any cycles and then finding a subset of edges that may be eliminated from the graph to remove all the cycles from the graph at a minimum cost. The determination of the existence of a cycle involves associating each vertex with an integer value and comparing the integer values of each pair of vertices that are connected by an edge. The integer values are assigned such that, if there is an edge from vertex A to vertex B, then the integer assigned to vertex A is smaller than the integer assigned to vertex B. If such an assignment of integers can be done on the whole graph, the graph is cycle free. However, if there are one or more cycles in the graph, such an ordering cannot be obtained. In such a case, the proposed method removes one or more edges from the graph, such that the aforementioned assignment of integers can be still performed on the resultant graph, thus rendering it cycle free. The proposed method reduces the inaccuracy that such cycle removal introduces in various applications.

DETAILED DESCRIPTION

Implementations of the present disclosure involve a system and/or method for minimum cost cycle removal from a directed graph. In particular, the present disclosure provides for a system and method for determining whether a directed graph contains at least one cycle and then determines which edges can be removed so that all cycles are removed. The removal of cycles may be done in such a way such that edges are removed to minimize cost, where cost is associated with an actual cost, a performance decrease, an importance of an edge, or any other metric. For example, the directed graph may be a weighted directed graph where each edge is weighted according to a level of importance or a cost of removal of the edge. The system may then evaluate the edges and determine which edge or combination of edges, when removed break all the cycles in the graph at the lowest cost.

Figure 1:
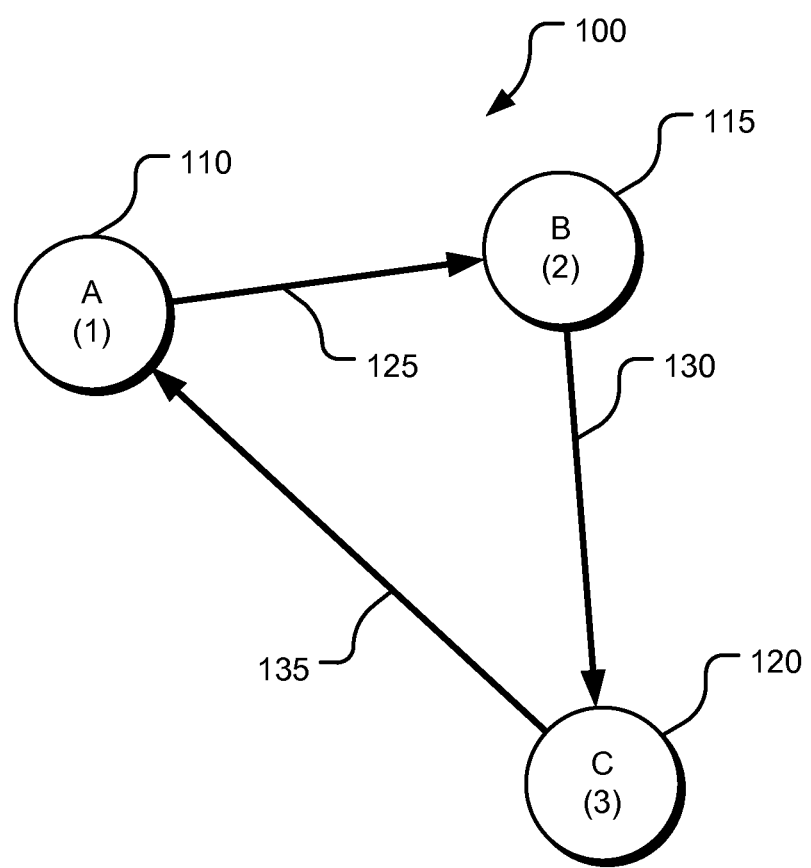
FIG. 1 is a block diagram illustrating an example of a directed graph featuring a cycle.
Figure 2:
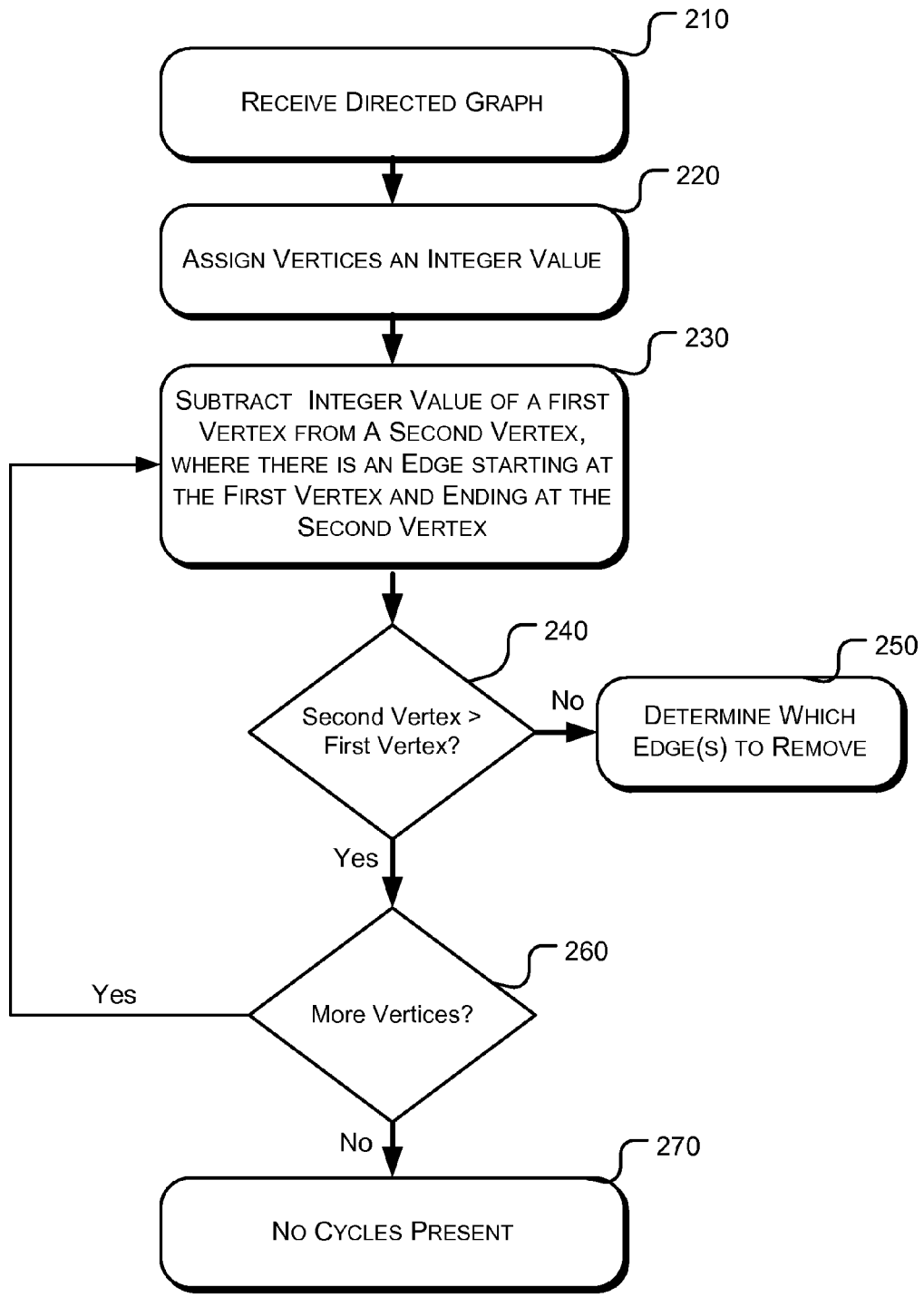
FIG. 2 is a block diagram illustrating an example method of detecting a cycle in a directed graph.

Referring now to FIG. 2, a method for determining whether a directed graph contains at least one cycle is depicted. The system receives a directed graph that includes at least two vertices and at least two edges (operation 210). The received directed graph may include any type of directed graph, and the vertices and edges in the directed graph may represent a series of operations in a software application, such as a software application configured to perform static timing analysis. In another example, each node in the graph may represent a functional unit in a datapath, such as an arithmetic logic unit (ALU), a binary multiplier, a digital logic circuit, or any other digital or analog circuit.

Figure 3:
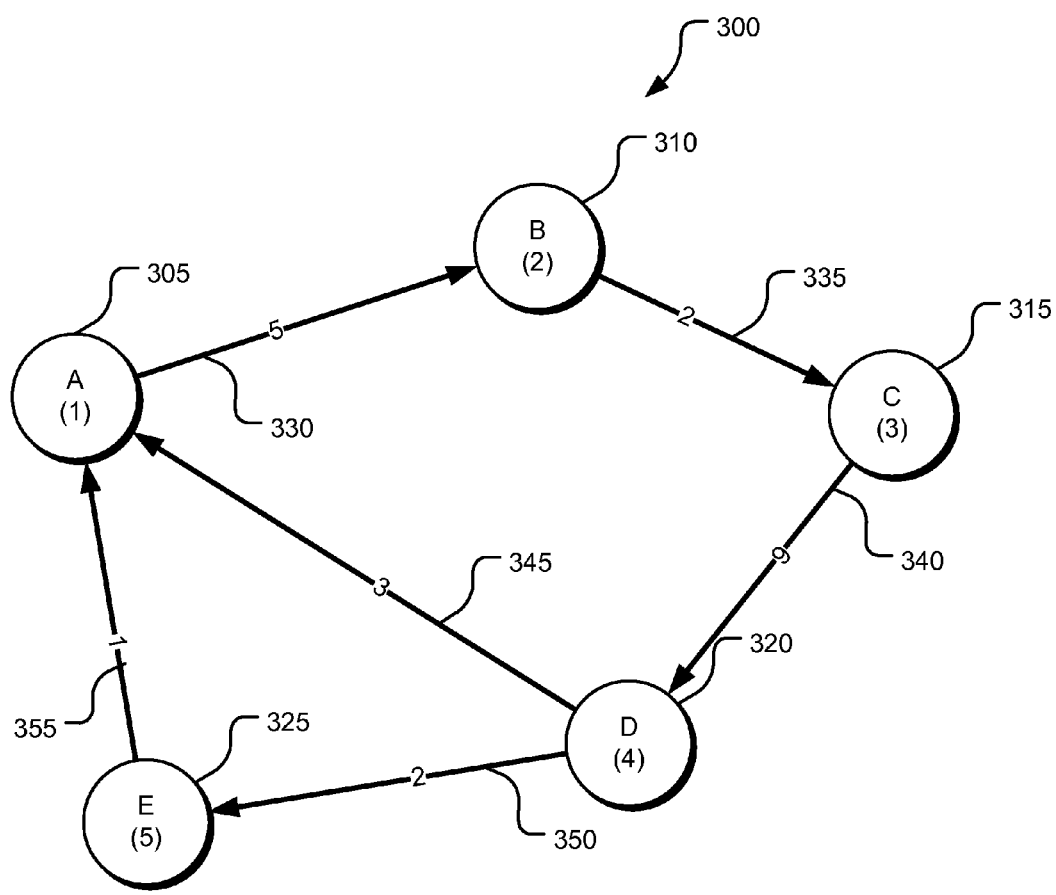
FIG. 3 is a block diagram illustrating an example directed graph that has multiple cycles.

Referring now to FIG. 3 and with continued reference to FIG. 2, each vertex in the directed graph 300 may be assigned an integer value (operation 220). In the graph 300, vertex A (305) has been assigned an integer value of 1, vertex B (310) has been assigned an integer value of 2, vertex C (315) has been assigned an integer value of 3, vertex D (320) has been assigned an integer value of 4, and vertex E (325) has been assigned an integer value of 5. Although in this example the values selected started at one and incremented by one, the system is not limited by the starting integer or how the integers are incremented. The first vertex assigned an integer value may be a first or starting vertex in a graph, or it may be randomly selected. Subsequent integer assignment should continue by traversing the graph along the directed edges. For example, in FIG. 3, vertex A (305) was assigned the value of 1. When traversing the graph 100 along the directed edges, the next vertex is vertex B (310), followed by vertex C (315), then vertex D (320), and vertex E (325). Vertices D and E are both then connected back to vertex A (305).

The system may analyze the graph by comparing the integer values of vertices that are connected by an edge (operation 230). When there is an edge directed from a first vertex to a second vertex, then the integer value of the second vertex must have a higher value than the first vertex. The graph contains a cycle when the value of the first vertex is higher than the second vertex. Graph 300 includes six edges. Thus, up to six comparisons may be made in order to determine if any cycles are present. Starting at the first vertex, for example, vertex A (305), the value at the first vertex is compared to an integer value at the second vertex (vertex B 310). In this example, vertex B (310) has a value of 2 and vertex A (305) has a value of 1. Thus, B>A and a cycle has not been identified (operation 240). The system may then determine whether more edges are present that have not been analyzed (operation 260). If no more edges are present, and no cycles have been identified, then the graph is cycle-free and the system may analyze another directed graph or exit (operation 270). In this example, there are five remaining edges, edge BC (335), edge CD (340), edge DA (345), edge DE (350), and edge EA (355). Continuing the analysis of the remainder of the graph 300, Vertex B (310) has a value of 2 and vertex C (315) has a value of 3. Thus, a cycle has still not been detected. Turning to the next vertex C (315) has a value of 3 and vertex D (320) has a value of 4. Skipping to edges DA (345) and EA (355), these edges each form a cycle. Applying the analysis, vertex D (320) has a value of 4, while vertex A (305) has a value of 1. Here, the first vertex (vertex D 320) has a greater value than the second vertex (vertex A 305). Thus, the presence of a cycle has been detected and the system determines which edge(s) should be removed to remove the cycle (operation 250). Similarly, vertex E (325) has a value of 5, while vertex A (305) has a value of 1. The graph 300 therefore has two cycles that both need to be removed.

Figure 4:
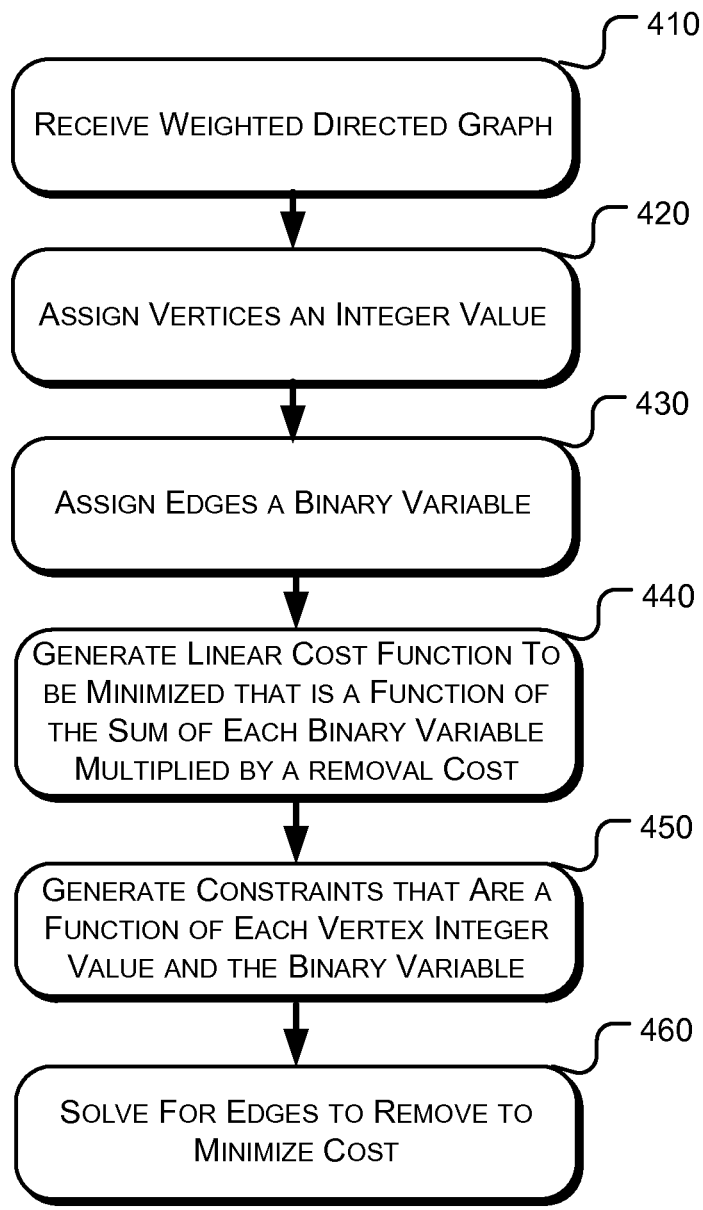
FIG. 4 is a block diagram illustrating an example method of determining a minimum cost edge or edges to remove from a directed graph in order to break each cycle in the directed graph.

Referring now to FIG. 4, and with continued reference to FIG. 3, a method of determining which edge or edges to remove in order to minimize cost is depicted. Once one or more cycles have been identified in the directed graph, the system determines which edge or edges may be removed in order to break the cycles. Since the graph is a representation of operations in a system, each edge may have a value indicating the importance of that edge or the cost of removing that edge to the system. The system receives the directed graph 300, including any edge weights (operation 410). The edge AB (330) has an edge weight of 5, the edge BC (335) has an edge weight of 2, the edge CD (340) has an edge weight of 9, the edge DA (345) has an edge weight of 3, the edge DE (350) has an edge weight of 2, and the edge EA has an edge weight of 1. If, for example, the directed graph represents a datapath, each vertex may be associated with a functional block and each edge may represent a connection for the movement of data. The value or cost of an edge may then be associated with the amount of data that is being passed from a first vertex to a second vertex. For example, if on average "X" bits are sent by operation "A" for use by operation "B", then the value of the edge AB may be set at X. Thus, the cost to break the edge between A and B is equivalent to the penalty that the system will encounter due to the break, in this case X bits are lost. In some cases, each edge may be equally important and may therefore all have the same weights. If the directed graph does not include any edge weights, the system may assign an equal edge weight to each edge.

Similar to the determination of whether the graph contains a cycle, the system may assign each vertex an integer value (operation 420). As with the determination of whether a cycle exists, these integer values may be used for determine the presence of cycles. The assigned integer values may be the same integer values assigned earlier, or may be a newly assigned value. Referring again to FIG. 3, each of the vertices has a set integer value.

In addition to an edge weight, each edge may also be associated with a binary variable (operation 430). The binary variable operates as Boolean variable that is used by the system to indicate whether the edge should be removed. If the variable has a value of 1 or true, then the edge should be removed. If the variable has a value of 0 or false, then the edge should be retained in the final cycle-free graph solution that is being generated. The binary variables are set in order to minimize a linear cost function according to a series of constraints.

The linear cost function is used to calculate the total cost for removing the cycles and is equal to the sum of the cost to remove each edge multiplied by the binary variable for each edge. In other words, the linear cost function is the total cost to remove one or more edges written as the sum of the edge weights each multiplied by their corresponding binary variable. The total cost to remove the cycle(s) in a graph may therefore be written according to equation 1.

$$TotalCost = \sum_{i=1}^{n} Cost_i * Break_i \quad (1)$$

where:
  n=total number of edges
  $Cost_i$=the cost for breaking an edge
  $Break_i$=the binary variable for breaking an edge The system minimizes the linear cost function in conjunction with the series of constraints to determine which edges should be broken to eliminate the cycles from the graph at a minimum cost. Applying this function to the values of FIG. 3, results in Equation 2.

$$TotalCost=5*Break_{AB}+2*Break_{BC}+9*Break_{CD}+3*Break_{DA}+2*Break_{DE}+1*Break_{EA} \quad (2)$$

The system also generates a series of constraints for producing a graph without cycles (operation 350). The constraints may be modeled after the method of determining the presence of a cycle by comparing the assigned integers at each pair of vertices as described with reference to FIGS. 2 and 3, in combination with the binary variable used to indicate when an edge is removed. The resulting constraint is shown in Equation 3.

$$DestinationVertexValue-StartVertexValue+Break_{StartDest}*Big>0 \quad (3)$$

Where:
  StartVertexValue=the integer value assigned to the vertex where the edge starts from
  DestinationVertexValue=the integer value assigned to the vertex that the edge is directed to
  $break_{startDest}$=the binary variable designating whether the edge will be removed
  big=a suitably large number selected such that if break is set to one, then the condition will be satisfied regardless of the start and destination vertex values.

Each constraint compares the destination vertex's start integer value to the vertex's integer value. If the starting vertex has an integer value that's greater than destination vertex's integer value, then the inequality is not true unless the binary variable is set to remove the edge (Break=1). The variable Big is set by the system to be larger than any possible outcome of the subtraction of the start vertex value from the destination vertex value. For example, in the graph 300, the vertex E (325) has the largest integer value in the graph and the vertex A (305) has the smallest integer value (5 and 1 respectively). In this case, if the value of the variable Big is set to 100, then for any possible combination of start and destination vertices, the constraint equation will be satisfied if the variable Break is set to 1. In many cases, it is advantageous to select a value for Big that isn't unnecessarily large. For example, using needlessly large values of Big may cause for extra computational cycles to be required to evaluate Equation 3. In one example, the value of big may be set to twice the number of edges in the graph.

The system generates one constraint for each edge in the graph. For example, again referring to the graph 300 depicted in FIG. 3, there are six edges 330-355. There would therefore be six constraints for the graph 300 and the value of the variable Big may be set to 12. The resulting set of constraints shown in Equations 4 may then be used as the set of constraints where $Break_{AB}$, $Break_{BC}$, $Break_{CD}$, $Break_{DA}$, $Break_{DE}$, and $Break_{EA}$ are all either zero or one.

$$Vertex_B-Vertex_A+Break_{AB}*12>0$$

$$Vertex_C-Vertex_B+Break_{BC}*12>0$$

$$Vertex_D-Vertex_C+Break_{CD}*12>0$$

$$Vertex_A-Vertex_D+Break_{DA}*12>0$$

$$Vertex_E-Vertex_D+Break_{DE}*12>0$$

$$Vertex_A-Vertex_E+Break_{EA}*12>0 \quad (4)$$

Once the linear equation and constraints have been generated, the system may solve for the values of each binary variable that satisfy the constraints and produce the minimum total cost to produce a cycle free graph (operation 360). This may be accomplished by utilizing any method of minimizing a linear equation according to constraints. For example, this may be accomplished by iterating through each possible combination of binary variables. Another way to solve for the combination of edges to break is to utilize linear programming.

Linear programming is generally directed towards achieving a best outcome for a mathematical model. A linear program requires a linear equation to minimize (or maximize), such as the one provided by Equation 1, constraints, such as those provided by Equation 3, and at least one variable, such as the binary variables. The linear program receives the total cost equation and constraints and is able to return the values of the binary variables that result in the best outcome, here the minimum total cost. The values of the binary variables may then be used to determine which edges to remove. The edges to be removed may then be provided to the system that is stuck in an infinite loop. Thus, breaking the loop at a minimized cost.

Figure 5:
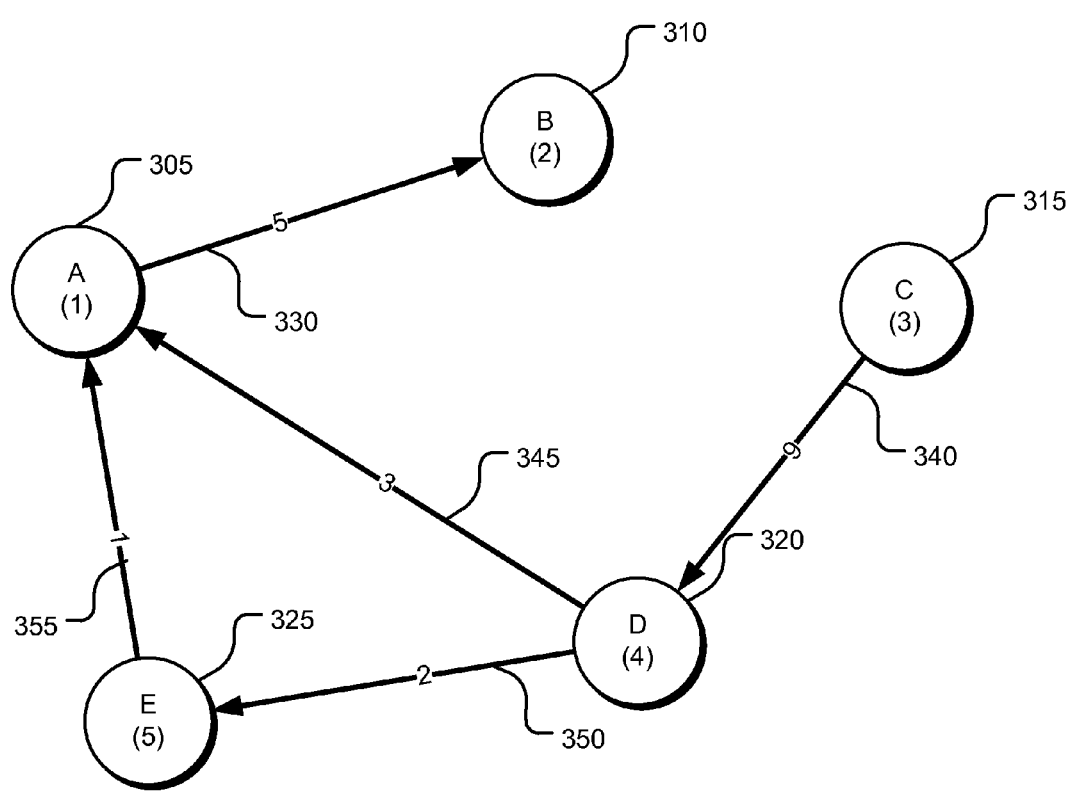
FIG. 5 is a block diagram illustrating an example directed graph with multiple cycles removed.

In the case of the graph 300, the system identifies which edge or edges may be removed to break the cycles at a minimum cost or reduced cost using linear programming. This results in the identification and removal of edge BC (335). FIG. 5, depicts the graph 500 which is the same graph as the graph 300, except the graph 500 has had the edge BC (335) removed. In this example, it is easy to see that edge BC (335) is the best edge to remove since the cost to remove BC is only 2 and it eliminates both cycles.

Figure 6:
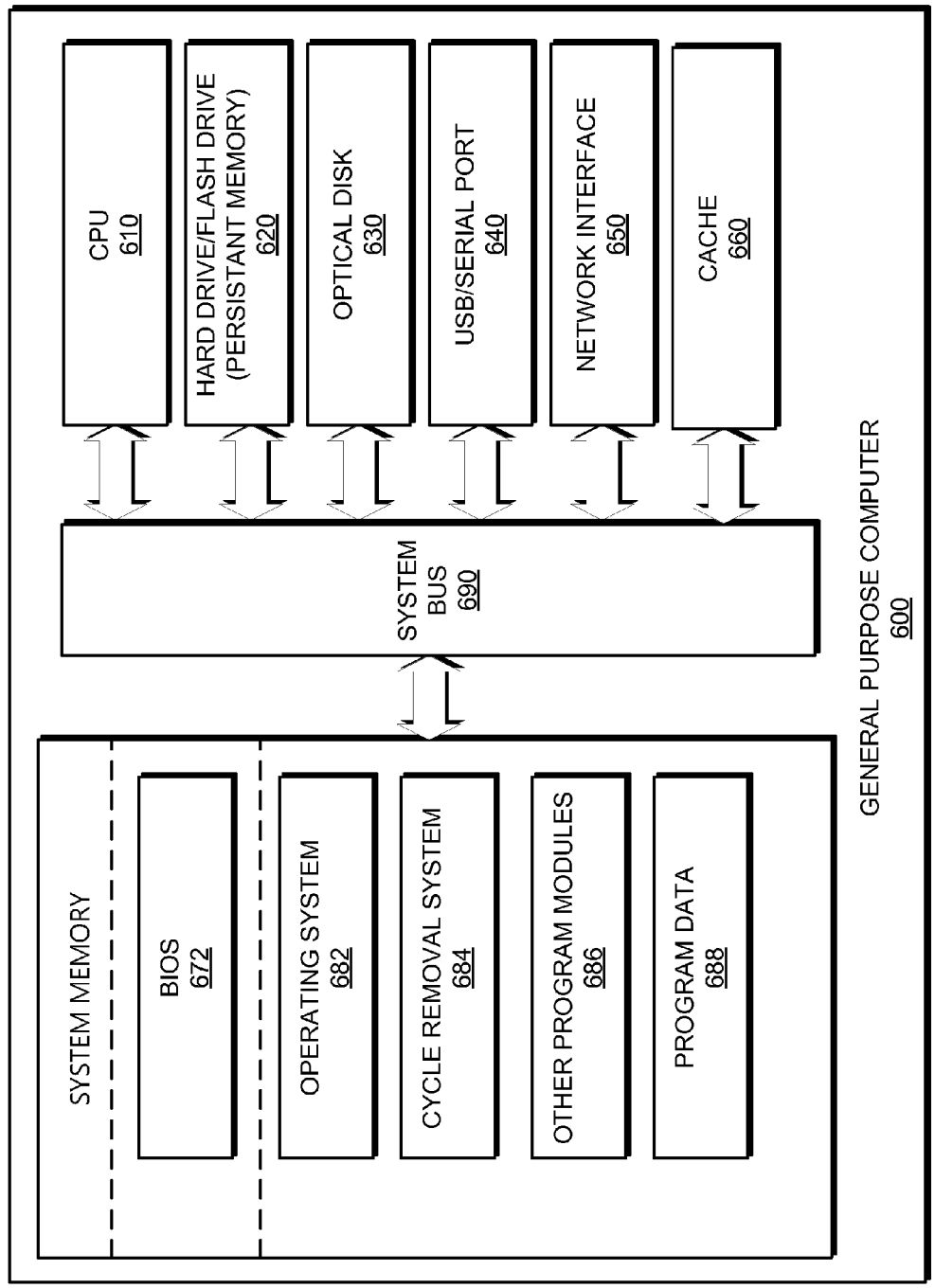
FIG. 6 is a block diagram illustrating an example of a general purpose computing system that may be used in the application of the present disclosure.

FIG. 6 illustrates an example general purpose computer 600 that may be useful in implementing the described technology. The example hardware and operating environment of FIG. 6 for implementing the described technology includes a general purpose computing device in the form of a personal computer, server, or other type of computing device. In the implementation of FIG. 6, for example, the general purpose computer 600 includes a processor 610, a cache 660, a system memory 670, 680, and a system bus 690 that operatively couples various system components including the cache 660 and the system memory 670, 680 to the processor 610. There may be only one or there may be more than one processor 610, such that the processor of the general purpose computer 600 comprises a single central processing unit (CPU), or a plurality of processing units, commonly referred to as a parallel processing environment. The general purpose computer 600 may be a conventional computer, a distributed computer, or any other type of computer; the invention is not so limited.

The system bus 690 may be any of several types of bus structures including a memory bus or memory controller, a peripheral bus, a switched fabric, point-to-point connections, and a local bus using any of a variety of bus architectures. The system memory may also be referred to as simply the memory, and includes read only memory (ROM) 670 and random access memory (RAM) 680. A basic input/output system (BIOS) 672, containing the basic routines that help to transfer information between elements within the general purpose computer 600 such as during start-up, is stored in ROM 670. The general purpose computer 600 further includes one or more hard disk drives or Flash-based drives 620 for reading from and writing to a persistent memory such as a hard disk, a flash-based drive, and an optical disk drive 630 for reading from or writing to a removable optical disk such as a CD ROM, DVD, or other optical media.

The hard disk drive 620 and optical disk drive 630 are connected to the system bus 690. The drives and their associated computer-readable media provide nonvolatile storage of computer-readable instructions, data structures, program engines and other data for the general purpose computer 600. It should be appreciated by those skilled in the art that any type of computer-readable media which can store data that is accessible by a computer, such as magnetic cassettes, flash memory cards, digital video disks, random access memories (RAMs), read only memories (ROMs), and the like, may be used in the example operating environment.

A number of program engines may be stored on the hard disk 620, optical disk 630, ROM 670, or RAM 680, including an operating system 682, a minimum cost cycle removal system 684 such as the one described above, one or more application programs 686, and program data 688. A user may enter commands and information into the general purpose computer 600 through input devices such as a keyboard and pointing device connected to the USB or Serial Port 640. These and other input devices are often connected to the processor 610 through the USB or serial port interface 640 that is coupled to the system bus 690, but may be connected by other interfaces, such as a parallel port. A monitor or other type of display device may also be connected to the system bus 690 via an interface, such as a video adapter 660. In addition to the monitor, computers typically include other peripheral output devices (not shown), such as speakers and printers.

The general purpose computer 600 may operate in a networked environment using logical connections to one or more remote computers. These logical connections are achieved by a network interface 650 coupled to or a part of the general purpose computer 600; the invention is not limited to a particular type of communications device. The remote computer may be another computer, a server, a router, a network PC, a client, a peer device, and typically includes many or all of the elements described above relative to the general purpose computer 600. The logical connections include a local-area network (LAN) a wide-area network (WAN), or any other network. Such networking environments are commonplace in office networks, enterprise-wide computer networks, intranets and the Internet, which are all types of networks.

The network adapter 650, which may be internal or external, is connected to the system bus 690. In a networked environment, programs depicted relative to the general purpose computer 600, or portions thereof, may be stored in the remote memory storage device. It is appreciated that the network connections shown are example and other means of and communications devices for establishing a communications link between the computers may be used.

The embodiments of the invention described herein are implemented as logical steps in one or more computer systems. The logical operations of the present invention are implemented (1) as a sequence of processor-implemented steps executing in one or more computer systems and (2) as interconnected machine or circuit engines within one or more computer systems. The implementation is a matter of choice, dependent on the performance requirements of the computer system implementing the invention. Accordingly, the logical operations making up the embodiments of the invention described herein are referred to variously as operations, steps, objects, or engines. Furthermore, it should be understood that logical operations may be performed in any order, unless explicitly claimed otherwise or a specific order is inherently necessitated by the claim language.

The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustrations only and are not intended to limit the scope of the present invention. References to details of particular embodiments are not intended to limit the scope of the invention.

What is claimed is:

1. A computer implemented method for optimizing a directed graph by minimizing a cost of removing at least one cycle of the directed graph, the method comprising:
    utilizing at least one hardware processing unit for:
        obtaining the directed graph including at least two vertices and at least one edge at a first computing device, wherein the at least two vertices of the directed graph represent at least two operations of a software application and the at least one edge of the directed graph represents a dependency between the at least two operations;
        assigning each vertex in the directed graph a unique value;
        identifying the at least one cycle in the directed graph; and
        determining the at least one edge to remove from the directed graph by:
            obtaining an edge weight for each edge in the directed graph;
            assigning the each edge a binary variable;
            generating a linear cost function that is equal to a sum of the each edge weight multiplied by the corresponding binary variable;
            generating a constraint for the each edge that is a function of the unique value of an ending vertex minus the unique value of a starting vertex plus a product of the binary variable associated with the each edge and a large number wherein the large number comprises at least double a total number of edges in the directed graph; and
            removing the at least one edge of the directed graph and the corresponding dependency between the at least two operations of the software application according to the linear cost function and the constraint.

2. The method of claim 1, wherein determining the presence of the at least one cycle in the directed graph comprises:
   subtracting the unique value of a first vertex from a second vertex, wherein an edge starts at the first vertex and ends at the second vertex; and
   comparing a result of the subtraction to zero, wherein a value less than zero indicates the presence of the at least one cycle.

3. The method of claim 1, wherein solving for the at least one edge to remove comprises determining a value of each binary variable by solving for the at least one edge to remove using a linear program that utilizes the linear cost function and the constraint.

4. The method of claim 1, wherein the large number is double a total number of edges in the directed graph.

5. The method of claim 1, wherein the edge weight for the each edge in the directed graph comprises a total number of bits lost as the function of removing the each edge from the directed graph.

6. The method of claim 1, wherein obtaining the edge weight for the each edge in the directed graph comprises assigning the each edge in an un-weighed directed graph an equal value.

7. The method of claim 1, wherein assigning the each vertex the unique value comprises:
   selecting a first vertex and assigning the first vertex a starting value;
   selecting a second vertex connected to the first vertex by an edge that starts at the first vertex and ends at the second vertex; and
   assigning the second vertex a value that is greater than the starting value.

8. A system for optimizing a directed graph by minimizing a cost of removing at least one cycle of the directed graph, the system comprising:
   a computing device including a processor coupled to a system memory, the system memory storing instructions for execution on the processor, the instructions configured to cause the processor to:
     obtain the directed graph including at least two vertices and at least one edge at a first computing device, wherein the at least two vertices of the directed graph represent at least two operations of a software application and the at least one edge of the directed graph represents a dependency between the at least two operations;
     assign each vertex in the directed graph a unique value;
     identify the at least one cycle in the directed graph; and
     determine the at least one edge to remove from the directed graph by:
       obtain an edge weight for each edge in the directed graph;
       assign the each edge a binary variable;
       generate a linear cost function that is equal to a sum of each edge weight multiplied by the corresponding binary variable;
       generate a constraint for the each edge that is a function of the unique value of an ending vertex minus the unique value of a starting vertex plus a product of the binary variable associated with the edge and a large number wherein the large number is set by the system to be larger than any possible outcome of a subtraction of the starting vertex value from the ending vertex value; and
     remove the at least one edge from the directed-graph and the corresponding dependency between the at least two operations of the software application according to the linear cost function and the constraint.

9. The system of claim 8, wherein determining a presence of the at least one cycle in the directed graph comprises:
   subtract the unique value of a first vertex from a second vertex, wherein an edge starts at the first vertex and ends at the second vertex; and
   compare a result of the subtraction to zero, wherein a value less than zero indicates the presence of the at least one cycle.

10. The system of claim 8, wherein solving for the at least one edge to remove comprises determining a value of each binary variable by solving for the at least one edge to remove using a linear program that utilizes the linear cost function and the constraint.

11. The system of claim 8 wherein the large number comprises double a total number of edges.

12. The system of claim 8, wherein the edge weight for the each edge in the directed graph comprises a total number of bits lost as the function of removing the each edge from the directed graph.

13. The system of claim 8, wherein obtaining the edge weight for the each edge in the directed graph comprises assigning the each edge in an un-weighed directed graph an equal value.

14. The system of claim 8, wherein assigning the each vertex the unique value comprises:
   select a first vertex and assigning the first vertex a starting value;
   select a second vertex connected to the first vertex by an edge that starts at the first vertex and ends at the second vertex; and
   assign the second vertex a value that is greater than the starting value.

15. A computer-implemented method of for optimizing a directed graph by minimizing a cost of removing at least one cycle of the directed graph, the method comprising:
   obtaining the directed graph including at least two vertices and at least one edge at a first computing device by a processor, wherein the at least two vertices of the directed graph represent at least two operations of a software application and the at least one edge of the directed graph represents a dependency between the at least two operations;
   assigning each vertex a unique value;
   determining a presence of at least one cycle in the directed graph by:
     subtracting the unique value of a first vertex from a second vertex, wherein an edge starts at the first vertex and ends at the second vertex; and
     comparing a result of the subtraction to zero, wherein a value less than zero indicates the presence of the at least one cycle; and
   determining the at least one edge to remove from the directed graph by:
     obtaining an edge weight for each edge in the directed graph;
     assigning the each edge a binary variable;
     generating a linear cost function that is equal to a sum of the each edge weight multiplied by the corresponding binary variable;
     generating a constraint for the each edge that is a function of the unique value of an ending vertex minus the unique value of a starting vertex plus a product of the binary variable associated with the each edge and a large number wherein the large number comprises at least double a total number of edges in the directed graph; and removing the at least one edge of the directed graph and the corresponding dependency between the at least two operations of the software application according to a linear program that utilizes the linear cost function and the constraint and determines a value of each binary variable to be assessed in removing the at least one edge.

16. The method of claim 15, wherein the large number is double a total number of edges.

17. The method of claim 15, wherein the edge weight for the each edge in the directed graph comprises a total number of bits lost as a function of removing the edge from the directed graph.

18. The method of claim 15, wherein obtaining the edge weight for the each edge in the directed graph comprises assigning the each edge in an un-weighed directed graph an equal value.

19. The method of claim 15, wherein assigning the each vertex the unique value comprises:

selecting the first vertex and assigning the first vertex a starting value;

selecting the second vertex connected to the first vertex by an edge that starts at the first vertex and ends at the second vertex; and assigning the second vertex a value that is greater than the starting value.

* * * * *

UNITED STATES PATENT AND TRADEMARK OFFICE
CERTIFICATE OF CORRECTION

| | | |
|---|---|---|
| PATENT NO. | : 9,176,732 B2 | |
| APPLICATION NO. | : 14/012799 | |
| DATED | : November 3, 2015 | |
| INVENTOR(S) | : Chakraborty et al. | |

It is certified that error appears in the above-identified patent and that said Letters Patent is hereby corrected as shown below:

IN THE CLAIMS
In claim 15,
-column 10, line 37, delete "of"

Signed and Sealed this
First Day of March, 2016

Michelle K. Lee
*Director of the United States Patent and Trademark Office*